United States Patent [19]

Mehdipour

[11] Patent Number: 4,660,173
[45] Date of Patent: Apr. 21, 1987

[54] THREE-DIMENSIONAL MAGNETIC BUBBLE DATA STORAGE AND OPTICAL RETRIEVAL SYSTEM

[76] Inventor: Fariborz Mehdipour, 209 Montana Ave., Santa Monica, Calif. 90403

[21] Appl. No.: 763,683

[22] Filed: Aug. 8, 1985

[51] Int. Cl.[4] ............................................. G11C 19/08
[52] U.S. Cl. ..................................... 365/10; 365/122
[58] Field of Search ................... 365/10, 122; 360/59, 360/131, 135; 369/13

[56] References Cited

U.S. PATENT DOCUMENTS 4,333,165  6/1982  Swainson et al. ................... 365/120

FOREIGN PATENT DOCUMENTS 0562865  8/1977  U.S.S.R. ................................ 365/10
0600613  3/1978  U.S.S.R. ................................ 356/10

OTHER PUBLICATIONS

IBM Technical Disclosure Bulletin–vol. 13, No. 1 Jun. 1970, pp. 147–148.

Primary Examiner—James W. Moffitt
Attorney, Agent, or Firm—Keith D. Beecher

[57] ABSTRACT

A three-dimensional magnetic bubble memory apparatus formed of at least two arrays of sheets, with the sheets of each array being mounted in spaced and parallel relationship and with the sheets of the two arrays being perpendicular to one another, and with each sheet being formed of light-transparent material producing magnetic bubble domains, and with a multiplicity of bubble generators being located along one edge of each sheet and being responsive to selected input signals for producing arrays of magnetic bubbles for movement along parallel channels on each sheet to selected positions representative of binary data to be stored in the memory apparatus, and which includes a light source positioned on one side of each array for directing a polarized light beam to the corresponding array, and a multiplicity of photocells positioned on the other side of each array respectively aligned with the locations on the sheets of the corresponding array at which magnetic bubbles are selectively positioned so that the amplitude of light reaching each of the photocells from the corresponding beam depends upon the presence or absence of magnetic bubbles.

7 Claims, 5 Drawing Figures

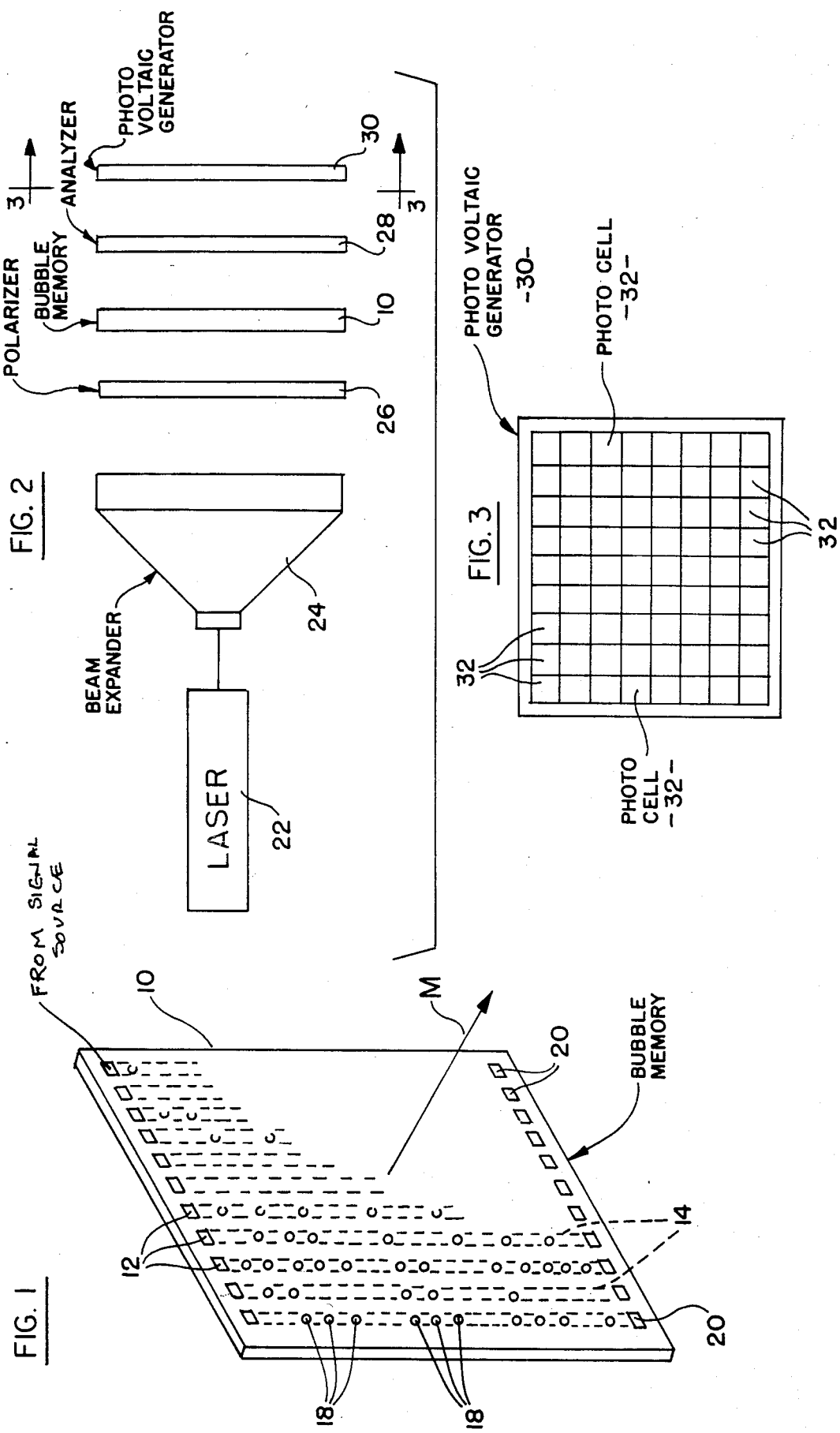

THREE-DIMENSIONAL MAGNETIC BUBBLE DATA STORAGE AND OPTICAL RETRIEVAL SYSTEM

BACKGROUND OF THE INVENTION

The existence of single wall magnetic domains in certain materials under particular conditions is described in many prior art publications and patents, and these are usually referred to as magnetic bubble assemblies. Most of the magnetic bubble data storage systems of the prior art are two-dimensional, that is, essentially planar. However, it is generally understood that three-dimensional data storage is more economical and more efficient and faster to access than the planar type. U.S. Pat. No. 3,983,547, for example, describes a three-dimensional magnetic bubble memory which may be used for data storage.

The prior art magnetic bubble devices usually require an in-plane rotating magnetic field for purposes of magnetic bubble propagation. The magnetic field acting in a thin patterned permalloy layer creates magnetic poles causing the magnetic bubbles to propagate in preferred directions as determined by the pattern. The rotating magnetic field in such arrangements is effective in the thin layer in which the permalloy lies. Such magnetic bubble devices may be made three-dimensional, to increase the data density without increasing the equipment necessary for generating the rotating magnetic field.

The prime objective of the assembly and system of the present invention is to provide a data storage and retrieval system, and the like, which includes a magnetic bubble memory for storing binary data which is preferably three-dimensional, and in which data retrieval is achieved by directing one or more laser beams through the memory onto corresponding photo-voltaic generator/detectors so that rapid data retrieval may be achieved.

Another object of the invention is to provide such an improved data storage and retrieval system which in addition to providing data retrieval on a rapid time basis is relatively economical and simple to construct, and which exhibits relatively small space requirements as compared with prior art data storage and retrieval systems.

BRIEF DESCRIPTION OF THE DRAWINGS

FIG. 1 is a schematic representation of a planar magnetic bubble assembly;

FIG. 2 is a schematic representation of the basic elements of the system of the present invention by which a laser beam is directed through a bubble memory onto a photo-voltaic generator/detector panel;

FIG. 3 is a front view of the photovoltaic generator/detector panel of FIG. 2 taken essentially along the lines 3—3 of FIG. 2;

DETAILED DESCRIPTION OF THE ILLUSTRATED EMBODIMENT

Figure 5:
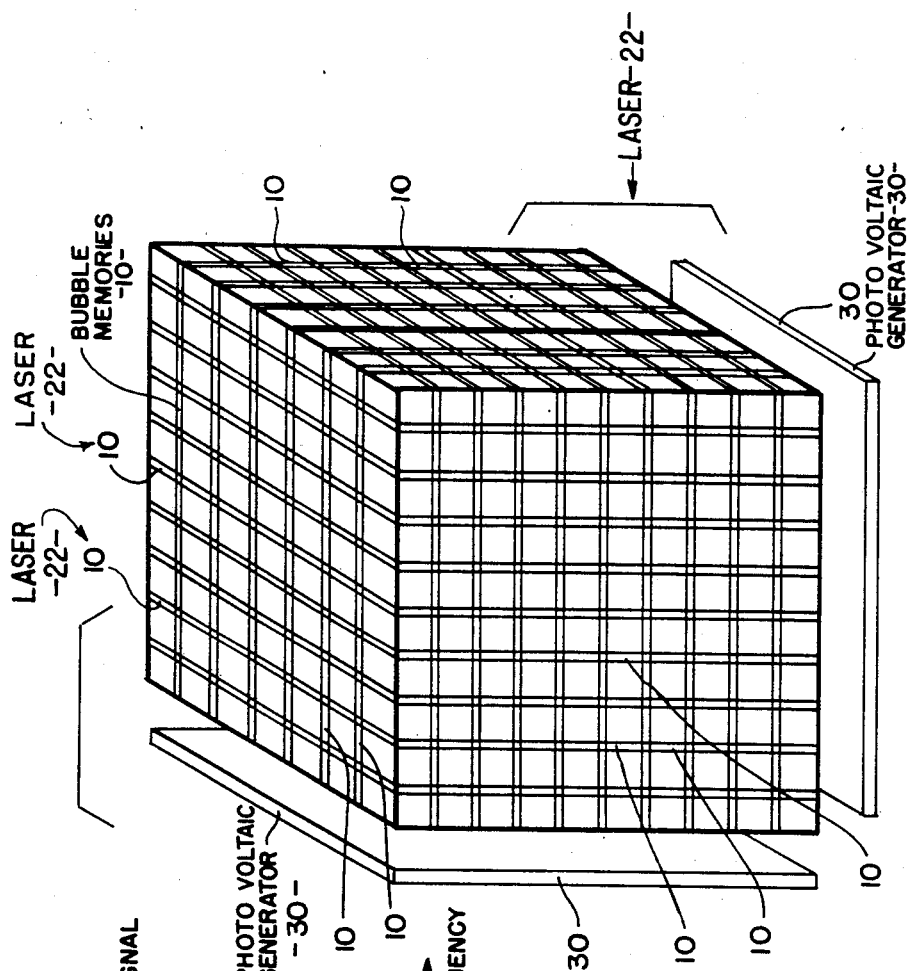
FIG. 5 is a schematic representation of a three-dimensional bubble memory system incorporating the concepts of the present invention.

The IBM Technical Disclosure Bulletin, published by International Business Machines Corporation, Volume 13, No. 1 June 1970, Page 147 contains an article entitled "Bubble Domain Electronic-to-Optical Image Transducer" by R. M. Craig et al which describes an arrangement of a single bubble domain in combination with a polarizer and an analyzer and wherein the optical transparency of the bubble is controlled by signals to the bubble generators to produce real-time spatial filters.

The elements shown in FIGS. 1 and 2 of the present specification are generally similar in some respects to the elements shown in the IBM Bulletin. As described in the IBM Bulletin, a thin sheet of a particular magnetic material, for example, an orthoferrite, have the property that, when they are subjected to a particular biasing magnetic field directed normally to the surface, small magnetic bubble domains with polarization oppositely directed to that of the rest of the material are formed. Local magnetic fields applied to the sheet can be used to generate or annihilate the magnetic bubbles, or to move the bubbles in desired directions. For example, conductive loops may be placed on the surface to generate magnetic fields which drive the bubbles in particular directions. Also, ferrite strip combinations may be used to guide the motion of the magnetic bubbles while a rotating magnetic field parallel to the surface provides the impetus for their movement.

A property of the orthoferrite magnetic bubble domain materials is that the polarization of light passing through the bubbles is altered in a manner different from that of the light passing through the remainder of the material because of the occurrence of magneto-optic rotation and change in wavelength. Accordingly, a laser beam is used in the system of the invention to read out the data stored in the bubble memory.

The polarization effects on the read-out laser beam are similar to the polarization effects encountered in a magnetic hologram as described in an article in the IEEE Transactions on Magnetics, Vol. MAG-6, No. 3, September 1970, by Haim M. Haskal entitled "Polarization and Efficiency in Magnetic Holography". However, the Haskal system uses magnetic grating as opposed to the magnetic bubbles of the present invention.

As described in the article, a laser beam $E_y$, linearly polarized in the Y plane, for example, is rotated by a magnetic hologram via the Faraday or Kerr effect. When such a beam $E_y$ is passed through a magnetic bubble, the polarization of the beam as it passes through the bubble is rotated by an angle Ft; where F is the specific Faraday rotation in degrees/centimeter and t is the thickness of the magnetic film forming the bubble.

In addition, the beam experiences attenuation by a factor $e^{-\alpha t}$, where $\alpha$ is the specific attenuation constant of the film.

It is convenient to decompose the beam emerging from the bubble into two components:

(a) a linearly y-polarized uniform plane wave of amplitude $E_y = E_0 e^{-\alpha t/2} \cos Ft$, (b) a linearly x polarized plane wave of amplitude $E_x = E_0 e^{-\alpha t/2} \sin Ft$, with a periodic phase reversal.

The transmission function for each independent polarization may be defined as:

$$\tau_y(x) = e^{-\alpha t/2} \cos Ft \qquad (1)$$

$$\tau_x(x) = p e^{-\alpha t/2} \sin Ft \qquad (2)$$

where $p = \text{sgn}\{[x-(nd+s/2)][x-([n+1]d-s/2)]\}$ for $nd \leq x \leq (n+1)d$, n is an integer. The transmission function for the y polarization is independent of x; therefore, the y component is not affected by the bubble.

The transmission function for the x polarization can be expanded in a Fourier series as follows:

$$\tau_x(x) = \qquad (3)$$

$$e^{-\alpha t/2} \sin Ft \left[ \frac{2s-d}{d} + \frac{4}{\pi} \sum_{n=1}^{\infty} \frac{1}{n} \sin \frac{\pi n s}{d} \cos \frac{2\pi n x}{d} \right].$$

The zero order intensity for the x polarization is $$I_0 = \left( \frac{2s-d}{d} \right)^2 e^{-\alpha t} \sin^2 Ft \qquad (4)$$

The first order intensity, which is responsible for wavefront reconstruction is given by $$I_1 = \eta = \frac{4}{\pi^2} e^{-\alpha t} \sin^2 \frac{\pi s}{d} \sin^2 Ft \qquad (5)$$

The maximum efficiency is obtained by differentiating (5) with respect to t. For small rotations the optimum thickness is given by $t-2/\alpha$. Thus $$\eta_{max} = \frac{4}{\pi^2} e^{-2} \left( \frac{2F}{\alpha} \right)^2 \sin^2 \frac{\pi s}{d}. \qquad (6)$$

The expression for efficiency (6) applies only to a readout beam normal to the memory plane; for non-normal incidence the efficiency decreases as $\cos^2\theta_i$, with $\theta_i$ being the angle of incidence. Futhermore, the attenuation increases somewhat because of the increased thickness the beam traverses. At 45° incidence, the efficiency is reduced by about a factor of three.

If N bubbles are illuminated at one time and $P_0$ is the incident beam power, the amount of energy available at the photo detector photovolatic generator 30 per bit is given by $E = \eta P_0 \Delta t_1 / N$ where $\Delta t_1$ is the integration time of the detector or equivalently the dwell time of the illuminating beam.

In the system of FIG. 1, sheet 10 of magnetic bubble domain material has a biasing magnetic field M applied to it. Sheet 10, for example, may be composed of an orthoferrite material. Fixed bubble generators 12 are located along the upper edge of sheet 10, by which magnetic bubble domains 18 are produced in a desired sequence in known manner from electric signals applied to the generators. These bubble domains correspond to data to be stored in the resulting magnetic bubble memory. The magnetic bubble domains 18 travel along parallel channels 14 into positions forming a desired pattern representing data stored in the memory, and they remain in those positions as long as desired.

The magnetic bubble memory on sheet 10 may be erased by shifting the bubbles 18 into bubble annihilators 20. At the same time, new data can be shifted into the memory from the bubble generators 12. Another method for erasing the magnetic bubbles 18 is to increase the overall magnetic field.

FIG. 2 shows a coherent optical processing system for retrieving data from the memory of FIG. 1. A high frequency collimated laser beam generated by a laser 22 and expanded by a beam expander 24 is passed through a polarizer 26, and the resulting polarized beam is used to illuminate the sheet 10 and the magnetic bubbles 18 thereon which represent data stored in the bubble memory. The polarized beam emerging from the bubble memory is passed through an analyzer 28 to a photovoltaic generator/detector 30.

Photovoltaic generator/detector 30, as shown schematically in FIG. 3, is made up of a multiplicity of individual photocells 32, and, due to the action of the polarizer 26 and analyzer 28, all of the cells 32 corresponding to areas of memory 10 which do not contain magnetic bubbles 18 are illuminated, and the cells aligned with the bubbles are not illuminated. In this manner, and by appropriate computer and data processing systems connected to the photovoltaic generator/detector 30, data represented by the positions of the magnetic bubbles 18 in the memory 10 can be retrieved.

The laser 22 is preferably a single frequency helium-neon laser and may, for example, be Model 200 marketed by the Laser Products Division of Coherent of Palo Alto, Calif. It has been found that high frequency lasers are subject to relatively large rotations and large variations in wavelength in passing through the bubbles. The Model 200 is a high frequency laser, and it is well suited for use in the system of the invention.

Figure 4:
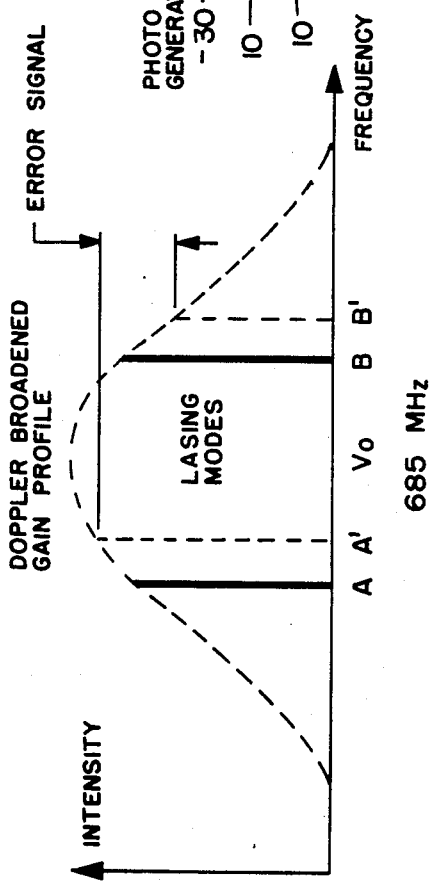
FIG. 4 is a curve showing certain characteristics of a laser unit which may be used in the system of the invention.

The Model 200 is a DC servo controlled helium-neon gas laser, operating at $\lambda_o = 632.8$ nm. The frequency composition of a laser output beam is determined by the characteristics of both the emitting medium and the laser tube. In the red HeNe laser, the center of the emission line is the 632.8 nm transition wavelength of neon (frequency $V_o = 473.6$ THz). The observed emission line width is broadened due to thermal motion of the emitting atoms. The resulting "Doppler broadened gain profile", shown as a dashed curve in FIG. 4, has a width of about 1500 MHz.

The lasing medium is contained in a precisely aligned mirror cavity which reinforces lasing only at the resonant frequencies of the cavity. For a given cavity length (L) there are an infinite number of resonant frequencies (longitudinal modes), each representing a different integral number of half-wavelengths contained within the cavity. These longitudinal modes are separated by a fixed frequency interval, C/2L, where C is the velocity of light in the lasing medium. For the Model 200 this mode spacing is 685 MHz.

There are loss factors in the cavity, such as transmission and absorption by the mirrors, which must be exceeded by the gain of the medium in order to sustain continuous lasing. In the Model 200 this limits the number of lasing fequencies to either two or three depending on the exact length of the cavity.

If the cavity length is such that only two modes are lasing and their intensities are equal (A and B in FIG. 4), their frequencies are uniquely defined with respect to the line center ($V_o$). A small (fractional wavelength) change in L has the effect of shifting these modes in frequency without changing their separation. As the cavity length changes (usually in response to thermal disturbances in the environment) the frequencies drift and one mode increases in intensity while the other decreases (A' and B'). Adjacent modes are orthogonally polarized, allowing them to be separated by a polarizing beamsplitter. The intensity difference between these two modes can be used as an error signal to control the legnth of the cavity. The cavity length is controlled by heating and cooling the laser tube. The operating temperature of the laser tube is chosen so that heat may be added or dissipated at approximately equal rates.

The beamsplitter is designed to transmit only one polarization, leaving a single, linearly polarized, longitudinal mode in the output beam. The spectral characteristics of this beam over a given time interval may be described in terms of frequency stability ($\Delta V/V_o$), effective linewidth ($\Delta V$ or $\Delta\lambda$) or coherence length (S). If we could take a nearly instantaneous look, we would find that the linewidth is a few KHz or less. However, because of fluctuations in the plasma, cavity length, etc., the frequency of this line drifts slightly over any finite time interval. In most applications this shifting frequency has the same effect as an increased "effective" linewidth ($\Delta V$). The coherence length is defined as that value of the optical path difference, between interfering beams from the same source, for which the fringe motion due to a frequency shift of $\Delta V$ (corresponding to a wavelength shift of $\Delta\lambda$) is equal to one fringe spacing:

$$S=(C/\Delta V)=(\lambda^2/\Delta 80)$$

In most free-running HeNe lasers thermal drift over periods of a few minutes or more makes the effective linewidth fill the entire doppler-broadened bandwidth ($\Delta V=1500$ MHz). Because of its active stabilization, the laser will maintain a coherence length of 15 meters ($\Delta V=20$ MHz) over periods of 24 hours or more. For periods of a few seconds the coherence length is more than 150 meters.

The following table gives the nominal output parameters for the Model 200. Due to the alternation of modes there is an absolute maximum range for the frequency of the output mode. This is roughly equal to ⅔ of the longitudinal mode spacing.

The behavior can best be understood by considering the thermal equilibrium that must exist for stable long term operation. Ideally the laser would be turned on, with the heater current fixed at its mid level, for a long enough time to allow the laser head to reach a stable thermal equilibrium with its environment. In this condition the heat flow due to the current in the heater wire (and the plasma discharge) is exactly balanced by the heat loss to the surrounding environment. In the absence of environmental temperature fluctuations, this results in a stable cavity length, but not necessarily one which provides a single mode output.

If the servo system is activated at this point the error signal described earlier causes a very slight change in heater current, sufficient to alter the cavity legnth (by a fraction of a $\rho$m) such that a single mode output is produced. If the thermal environment remains constant, the equilibrium is stable at the mid-level heater current. Subsequent temperature changes in the environment cause changes in the heat loss rate which are accommodated by the servo, so as to maintain the output mode to which it is locked. The optical frequency of this mode will thus move from its nominal value by an amount determined by the amount of temperature change experienced since the initial servo lock.

The laser uses a bipolar stabilization technique which always chooses the lock point to be at a stable equilibrium point. This technique has two advantages. Firstly, the ambient temperature operating range is increased 0°–40° C.). Secondly, if laser were to lose lock, the unit will always relock at its equilibrium point. Thus the unit will always stay within its operating parameters and never overheat.

In order to accelerate the warm-up time, the unit starts up in a fast-heat mode until the laser reaches its equilibrium point. At this time the servo is activated and operates as described. Thermal equilibrium is soon established and a stable output is maintained. The output frequency will differ from its nominal value to the extent that the operating environment differs from that in which the system was initially adjusted.

The laser described above is a true single frequency laser. The beam is contained within 0.01 GHz of its center frequency (0.001 GHz over 1 second interval). Only one wavelength is emitted from the laser at any time.

The advantage of the unit's stabilization technique is that it provides a reliable, DC coupled output that if free from dither used in FM stabilization techniques. Besides excellent short term stability, the unit provides inherent long term stability. Nominal long term performance is given on the following page.

Significant Values for Model 200 HeNe Laser

Reference Values

Speed of Light in Vacuum: $C=299.7928\times 10^6$ m/sec
HeNe Laser Center Frequency: $V_o=473.6128\times 10^{12}$ Hz
HeNe Laser Center Wavelength: $\lambda_o=632.9914\times 10^{-9}$ M (vac)
Model 200 Laser Cavity Length: $L=0.219$ m
Frequency Spacing of $TEM_{oo}$ Mode: $C/2L=685\times 10^6$ Hz Output Values Nominal Frequency: $V=V_o-C/4L=473.6126\times 10^{12}$ Hz
Absolute Max Range: $\Delta V\approx\pm C/6L=\pm 228\times 10^6$ Hz
Nominal Wavelength: $\lambda=C/V=632.9916\times 10^{-9}$ m (vac)
Absolute Max Range: $\Delta\lambda\approx\pm 305\times 10^{-15}$ m (vac)
Stability Figures:

| Duration | ($\Delta V$) Freq. Range | ($\Delta\lambda$) Range | (S) Coherence Length | (Parts Per Million) Stability Ratio |
|---|---|---|---|---|
| 5 minutes | 2 MHz | $2.67\times 10^{-6}$ nm | 150 m | .004 PPM |
| 1 C.° amb. chg. | 5 | $6.68\times 10^{-6}$ | 60 m | .01 |
| 24 hours ($\pm 5$ C.°) | 50 | $66.8\times 10^{-6}$ | 6 m | .10 |
| Absolute Max | 380 | $508\times 10^{-6}$ | 0.75 m | .80 |

The photovoltaic detector/generator 30 of FIG. 3 is made up of a multiplicity of independent photocells 32. These cells are respectively aligned with position points on the bubble memory 10 of FIG. 1, and each cell produces an electric current which has a relatively low value for each position occupied by a magnetic bubble, and a relatively high value for each position not so occupied. Photovoltaic generators are known to the art, and a description thereof may be found in Chapter 5 of a text entitled "Direct Energy Conversion", 3rd Edition, Stanley W. Angrist (1976) published by Allyn & Bacon, Inc. of Boston.

A three-dimensional embodiment of the bubble memory of FIG. 1 is shown in FIG. 5, in which a plurality of planar bubble memories, such as shown in FIG. 2, are positioned in spaced parallel relationship along each of three planes to intersect one another mutually at right angles, so as to form a cube, as shown in FIG. 5. The three-dimensional bubble memories may also be formed as a cylinder, as a cube, or any other desired configuration. Three distinct lasers 22 are directed at the respective bubble memories in the three mutually perpendicular planes, through the elements described in conjunction with FIG. 2. Also, three distinct photo-voltaic detector/generators 30 are provided (two being shown), one for each plane.

The bubble memory of FIG. 5 provides a simple and efficient three-dimensional data storage, with the planar bubble memories in each plane operating in the same manner as described in conjunction with FIGS. 1 and 2. By computing the intensities and rotation angle, and change of wavelength, of the laser beams reaching each of the three photovoltaic generators 30 with respect to the individual photocells thereof, the three-dimensional location of each bubble in the three-dimensional memory may be computed.

The invention provides, therefore, a relatively simple and inexpensive bubble memory system by which almost instantaneous access to data stored in the memory is achieved by using a laser/photovoltaic read-out.

It will be appreciated that while particular embodiments of the invention have been shown and described, modifications may be made. It is intended in the claims to cover all modifications which come within the true spirit and scope of the invention.

I claim:

1. A three-dimensional magnetic bubble memory apparatus comprising: at least two arrays of sheets, with the sheets of each array being mounted in spaced and parallel relationship, and with the sheets of the two arrays being mounted perpendicular to one another, and with each sheet being formed of light-transparent magnetic material capable of producing magnetic bubble domains; bubble generator means mounted on a first edge of each of the sheets of each of said arrays and responsive to selected input signals for producing arrays of magnetic bubbles for movement along parallel channels on the corresponding sheet to selected positions in the parallel conducting channels representative of binary data to be stored in the memory; a light beam source positioned on one side of each of said arrays for causing a light beam to be incident on the corresponding array; light polarizing means mounted between the light source and the corresponding array for polarizing the light beam incident on the corresponding array; bubble annihilator means mounted on each of said sheets of each of said arrays for erasing previous bubbles each time bubbles representing new binary data are produced by said generator means; photo-voltaic generator means positioned on the other side of each of the arrays comprising a plurality of photocells respectively aligned with the locations in the parallel conducting channels on the sheets of the corresponding array on which the magnetic bubbles are selectively positioned; and further polarizing means positioned between each of said photo-voltaic generator means and the corresponding array, the amplitude of light reaching each of said photocells from the corresponding beam being determined by the presence or absence of magnetic bubbles at individual ones of said locations, and said photocells producing electrical signals having an amplitude determined by the amplitude of light reaching respective ones of said photocells as determined by the presence or absence of magnetic bubbles in the locations corresponding thereto.

2. The three-dimensional magnetic bubble memory apparatus defined in claim 1, in which each of said light beam sources includes a laser.

3. The three-dimensional magnetic bubble memory apparatus defined in claim 2, in which said laser is of the high frequency type.

4. The three-dimensional magnetic bubble memory apparatus defined in claim 3, in which said laser is a single frequency laser.

5. The three-dimensional magnetic bubble memory apparatus defined in claim 1, in which each of said sheets is formed of an orthoferrite material.

6. The three-dimensional magnetic bubble memory apparatus defined in claim 1, in which the light beam from each of the light beam sources is incident on the sheets of each of said arrays in a perpendicular relationship.

7. A three-dimensional magnetic bubble memory apparatus comprising: at least two arrays of sheets, with the sheets of each array being mounted in spaced and parallel relationship, and with the sheets of the two arrays being mounted perpendicular to one another, and with each sheet being formed of a light-transparent magnetic material capable of producing magnetic bubble domains; bubble generator means mounted on a first edge of each of said sheets of each of said arrays and responsive to selected input signals for producing a multiplicity of magnetic bubbles for movement along parallel conducting channels of the corresponding sheet to selected positions representative of binary data to be stored in the memory; a laser light source positioned on one side of each of said arrays for causing a laser beam to be incident on one side of the corresponding array; bubble annihilator means mounted on each of said sheets of each of said arrays for erasing previous bubbles each time bubbles representing new binary data are produced by said generator means; and means positioned on the other side of each of said arrays comprising a plurality of detectors respectively aligned with locations in said parallel conducting channels on the sheets of the corresponding array to which magnetic bubbles are selectively positioned, said detectors respectively producing electric signals having an amplitude determined by the amplitude of light reaching respective ones of said detectors as determined by the presence or absence of magnetic bubbles in the locations corresponding thereto.

* * * * *